INVENTOR
D. DINELLA
BY [signature]
ATTORNEY

Jan. 3, 1967 D. DINELLA 3,296,099

METHOD OF MAKING PRINTED CIRCUITS

Original Filed Aug. 30, 1962 4 Sheets-Sheet 2

INVENTOR
D. DINELLA
BY [signature]
ATTORNEY

INVENTOR
D. DINELLA
By [signature]
ATTORNEY

INVENTOR
D. DINELLA
BY [signature]
ATTORNEY

United States Patent Office 3,296,099
Patented Jan. 3, 1967

3,296,099
METHOD OF MAKING PRINTED CIRCUITS

Donald Dinella, Clark, N.J., assignor to Western Electric Company, Incorporated, New York, N.Y., a corporation of New York Continuation of application Ser. No. 220,383, Aug. 30, 1962. This application May 16, 1966, Ser. No. 550,568
10 Claims. (Cl. 204—15)

This is a continuation of abandoned application Serial No. 220,383, filed August 30, 1962. This invention relates to the manufacture of metallic configurations and, more particularly, to electrical printed circuit boards and their method of manufacture.

The present emphasis toward miniaturization and semiconductor use in communications systems and the like has accelerated an already rapid rate of growth in printed wiring.

Printed circuit boards for commercial applications have heretofore generally comprised one of two basic types of non-metallic substrates, either phenol fibre laminates or epoxy glass laminates. Both of these substrates exhibit inherent disadvantages from a manufacturing as well as a performance standpoint. More specifically, phenolic laminates exhibit poor mechanical strength and electrical properties which deteriorate with age. Epoxy glass laminates have better mechanical and electrical properties, but are difficult to fabricate and are more expensive than phenolic laminates.

In addition, both of the aforementioned nonmetallic substrates exhibit poor thermal conductivity which is particularly important in miniaturized systems applications. Further, in printed circuits where plated-through circuit holes are spaced very close together, both of the aforementioned substrates exhibit deterioration in their electrical properties caused by exposure to a number of chemical solutions, such as certain of those used during circuit plating operations.

As attempts have been made to utilize boards with these substrates in more extensive applications, another very serious and troublesome problem has come to the forefront. This involves finding ways to minimize undesired interference effects between the various closely spaced circuit leads and holes. Such interference effects may be caused selectively by the following: stray electric and/or magnetic fields giving rise to undesired capacitive or inductive intercoupling, radiation, or eddy currents. As is well known, excessive interference caused by any of the aforementioned effects can give rise to intolerable circuit noise, can render a circuit unstable, or in some cases, can actually render the circuit inoperative. The severity of such interference becomes particularly pronounced and difficult to eliminate through changes in circuit design as the signal frequencies utilized and/or the total surface area of the circuit board is reduced, such as necessitated for miniaturization. Excessive intercoupling or interference experience with prior art circuit boards has often necessitated the use of auxiliary ground leads positioned between certain or all of the circuit leads adjacent one another. This approach to the problem not only results in intricate and complex circuit configurations, but requires increased board area, thus obviating the benefical aspects of miniaturization.

Another factor of considerable importance involved in the design and manufacture of high-quality printed circuit boards and the like relates to the construction of the circuit holes. More specifically, for mechanical reasons, the hole diameter should be approximately equal to or greater than the board thickness if reliable punching or drilling of the holes is to be achieved on an assembly line basis. However, both mechanical problems involved in punching (or drilling) holes of the necessary small diameter and metal deposition problems involved in uniformly plating the inner walls of such holes increase as the board thickness decreases. Sharp edges, such as the peripheral edges of punched or drilled holes in nonmetallic circuit boards compound the problem of obtaining a uniform coating thickness. Countersinking the holes, so as to provide smooth, conical surfaces, for example, may reduce the sharpness of the edges, but would result in a metallic island or land area surrounding each hole of prohibitive diameter in many circuits wherein close spacings are required.

Other disadvantages of phenol fibre or epoxy glass printed circuit boards are that they do not lend themselves to simple formnig, shaping, and punching (or stamping) operations on an economical assembly line basis. Similarly, they do not lend themselves to bending or shaping into specific configurations, such as a chassis, before or after a printed circuit has been applied thereto.

It is thus seen that, at best, the selection of a prior art printed wiring board has been one of compromise between structural design, performance, ease of manufacture, and material cost.

Accordingly, it is an object of this invention to improve printed circuit boards and the like from both a manufacturing and a performance standpoint.

Another object of this invention is to improve both the electrical and physical properties of printed circuit boards.

A further object is to minimize deleterious interference effects between adjacent printed circuit leads in a simple, effective and unique manner so as to reduce circuit noise substantially and/or to permit a substantial reduction in circuit board surface area requirements.

An additional object of this invention is to reduce the cost of manufacturing printed circuit boards of durable, rigid, economical and uniquely simple construction.

Still further objects of this invention are to eliminate deterioration in the electrical properties of circuit board substrates caused by either age or exposure to chemical solutions, and to minimize both the mechanical problems encountered in making, and the metal coating problems encountered in uniformly plating, circuits and lead holes of minute diameter.

In accordance with the principles of the present invention, a printed circuit board of unique construction comprises a metal substrate having a common ground. The board and its method of manufacture both exhibit very important and unique features. For example, with respect to physical and mechanical properties, the circuit board as embodied herein provides a substantial improvement over conventional nonmetallic boards in terms of strength, durability, thermal conductivity, ease of manufacture, adaptability to shaping before or after processing, being impervious both to chemicals involved in manufacture and to age, and in acting as an effective heat sink.

In accordance with an aspect of the invention, a terminal region on the substrate is provided to make possible a common ground return for the printed circuit. This has been found to be of particular importance from an electrical standpoint in that it substantially minimizes troublesome stray electrical and/or magnetic field effects between adjacent circuit (or leads) to the metal substrate. The common ground return also is believed to localize eddy currents. As a result of such grounding, which is not possible with prior nonmetallic based boards, a reduction in circuit noise and/or a substantial reduction in surface area requirements is possible, the latter, of course, being necessary for circuit miniaturization.

Other aspects of the invention relate to the methods of manufacturing the circuit boards. In accordance with one preferred method, a fluidized bed process is utilized to apply a coating of pulverulent insulating material, such as epoxy resin, on the metal substrate with prepunched holes therein. Significantly, this process, as applied to the prepunched substrate, has been found to result in an insulating coating which is characterized by rounding the otherwise sharp peripheral edges of the punched (or drilled) holes to such an extent that the inner walls thereof become crescent-shaped and smoothly contoured into the planar surfaces of the board. As viewed in cross-section, the coated holes actually become cusp-shaped at their ends. For reasons set forth in greater detail hereinbelow, such hole formation makes possible uniform internal plating, and facilitates both miniaturization of the circuits and soldering of the connections to the boards. As will presently be seen, these features and advantages all contribute directly or indirectly to a unique embodiment exhibiting a substantial improvement over all forms of prior, conventional counterparts in terms of both electrical, mechanical, and thermal characteristics.

Other process steps involved in one preferred and unique method of manufacturing circuit boards in accordance with this invention comprises abrading and sensitizing the insulating coating on the substrate in any well-known manner and then applying a very thin metallic coating thereto, preferably by an electroless process. This thin metallic coating serves primarily to make the board conductive so that it can be utilized as one of the electrodes in a subsequent electrolytic plating operation. The board is then masked, preferably utilizing a silk-screen process, so that the desired circuit configuration may be electroplated thereon to the desired thickness. The mask (or resist material) is then removed and the board chemically etched, leaving the desired circuit configuration. In alternate methods embodied herein, a metallic foil may be utilized in place of the electroless and/or electroplating steps if plated-through circuit holes and eyelets are not required.

While the present invention is being described with reference to printed circuit boards and their method of manufacture, it is to be understood that metallic patterns fabricated on metal substrates in accordance with the invention may be utilized to form other types of electrical apparatus, such as commutators or sliding contact switches, for example.

These and other objects and advantages of this invention may be more readily understood from a consideration of the following detailed description taken in conjunction with the accompanying drawings, in which.

Figure 1:
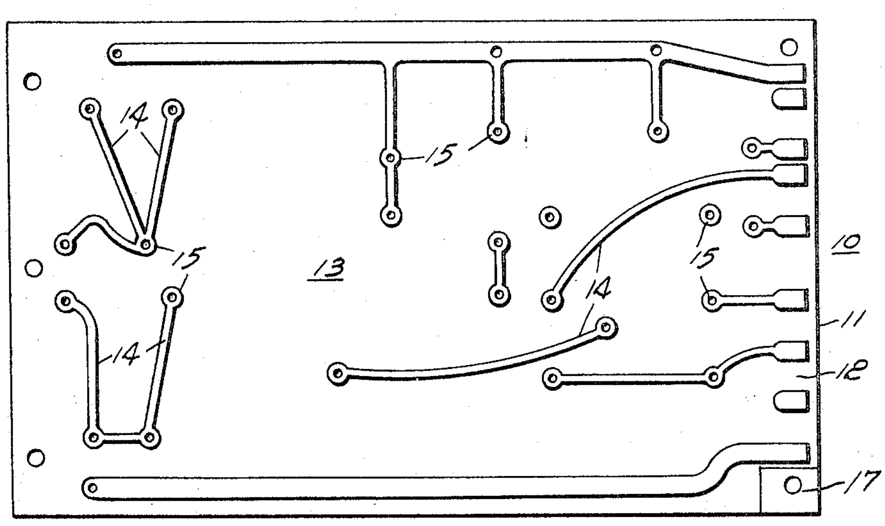
FIG. 1 is a plan view of a printed circuit board embodying features of the present invention.
Figure 2:
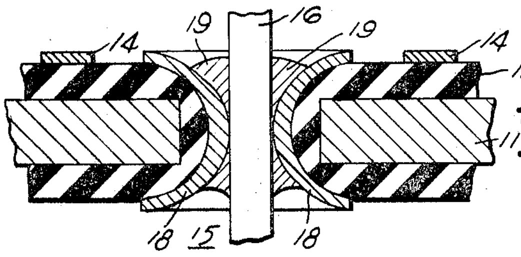
FIG. 2 is an enlarged view in cross-section depicting certain features of the board of FIG. 1.
Figure 5:
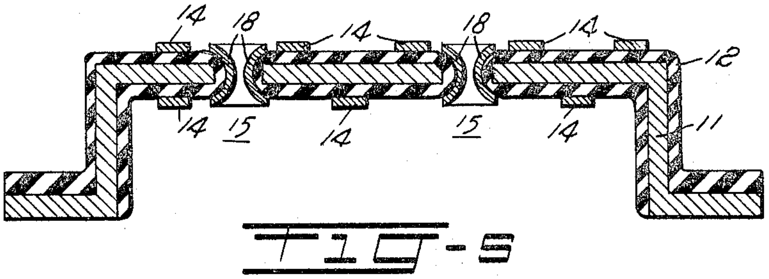
Figure 6:
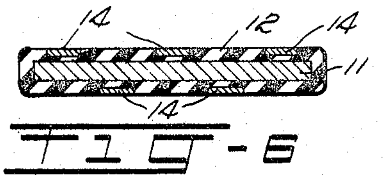
Figure 3:
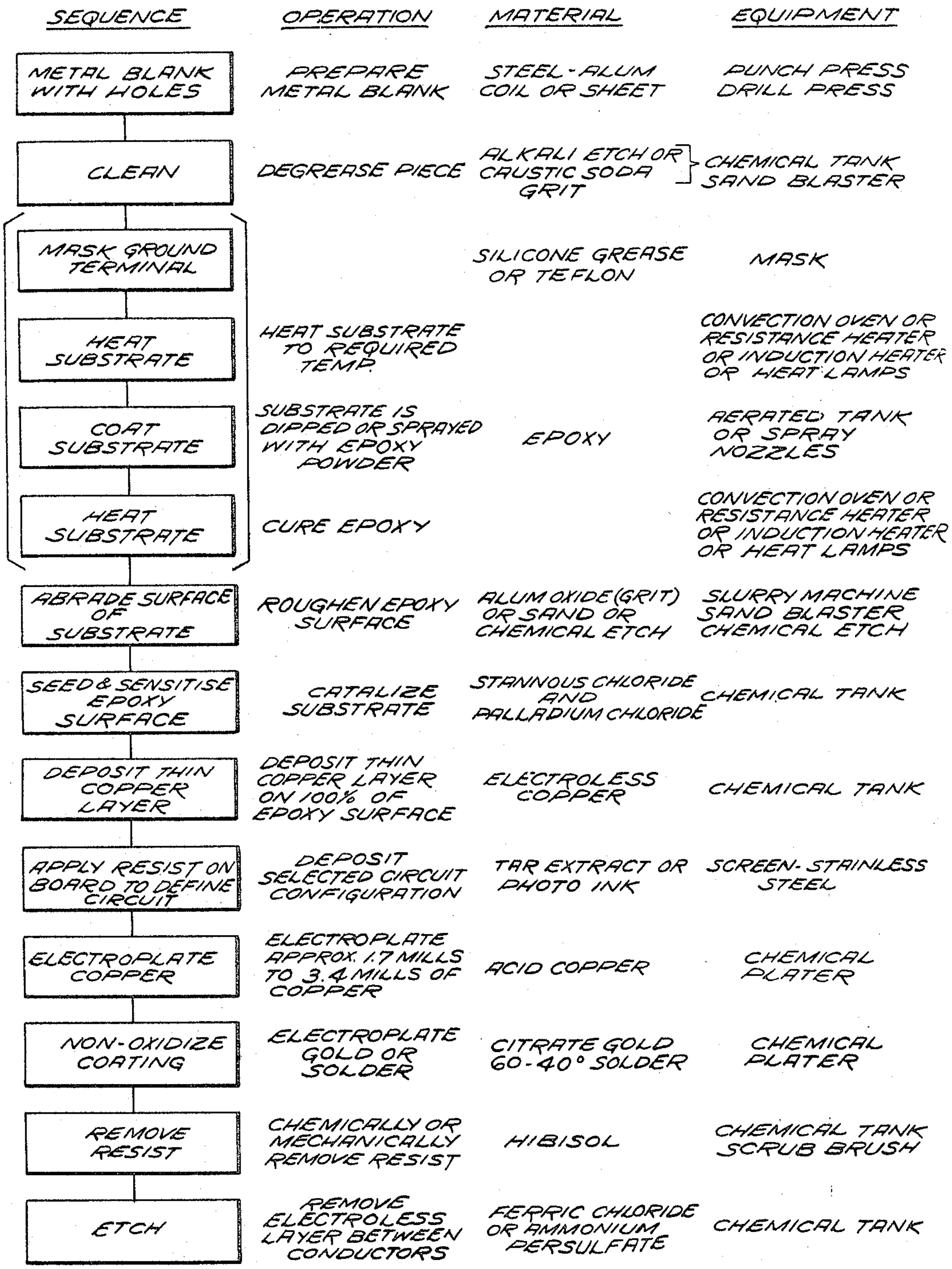
FIG. 3 depicts a flow chart and associated tabulated information which is presented as an aid to an understanding of one preferrred method of processing a circuit board of the type depicted in FIG. 1.
Figure 4:
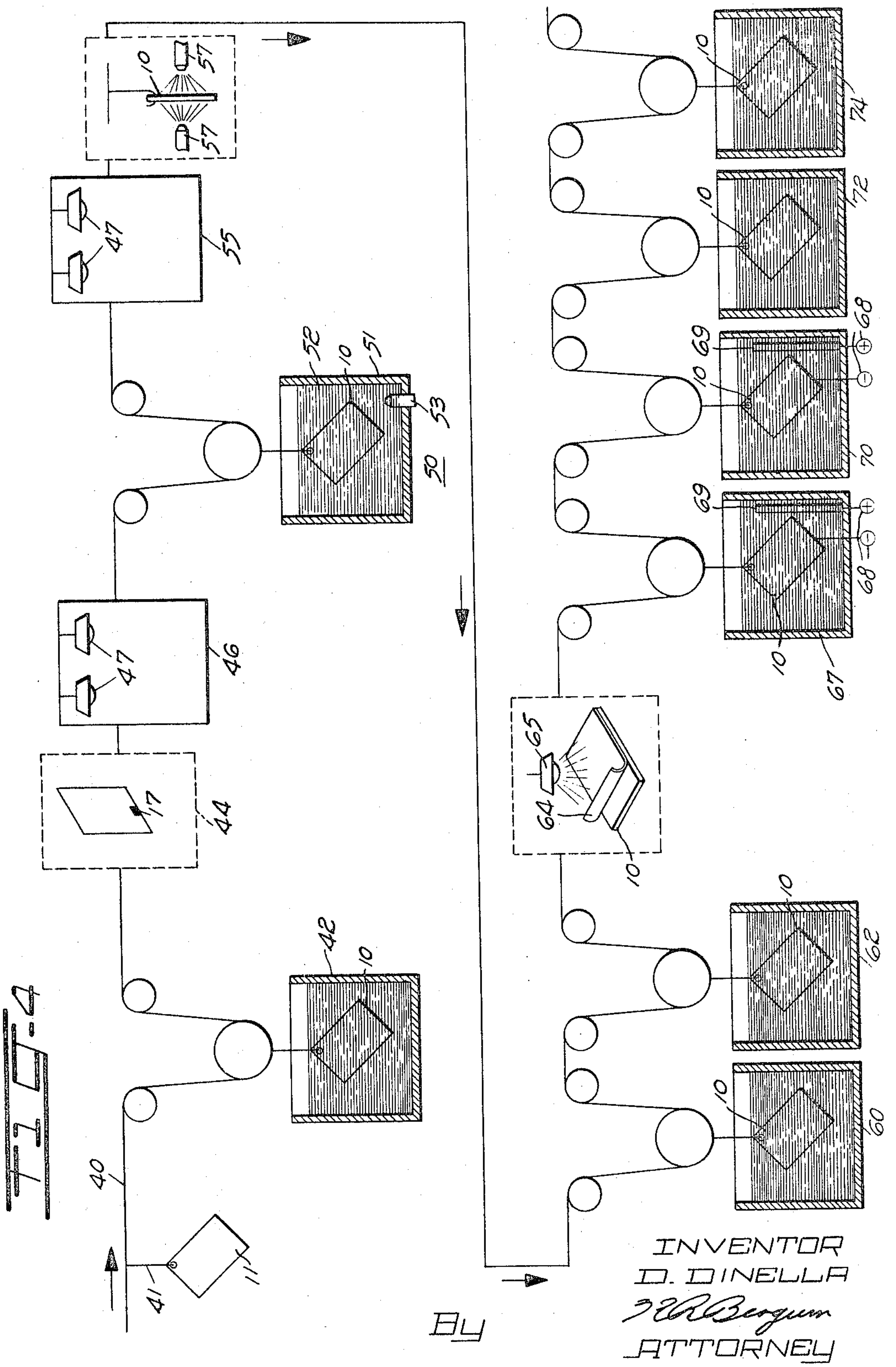

FIG. 4 schematically and pictorially depicts illustrative equipment which may be utilized in carrying out the method of manufacture set forth in FIG. 3;

FIG. 5 depicts in cross-section an alternate form which the circuit board of FIG. 1 may take in accordance with the invention;

FIG. 6 is an enlarged view in cross-section depicting a modification of the embodiment depicted in FIGS. 1 and 2, and FIG. 7 depicts two alternative flow charts in accordance with the principles of this invention.

Considering the invention more specifically, FIG. 1 depicts a unique printed circuit board 10 utilizing a metal-base substrate 11. The substrate may comprise any one of a number of metals, such as steel or aluminum, formed from coil or sheet stock, for example. Aluminum or brass is particularly well suited in applications where the substrate must be non-magnetic. The substrate is coated with a material to provide a suitable insulating surface 12 upon which a circuit 13 of desired configuration may be deposited. This circuit normally comprises a plurality of metallic leads 14 and plated-through holes 15. A detailed sectional view of the circuit board of FIG. 1 is shown in FIG. 2.

In accordance with the invention, a common ground terminal area 17 is employed effectively to reduce any troublesome interference effects that might otherwise exist between closely spaced circuit leads or terminal holes. It has been found that a metal substrate, when grounded, substantially reduces circuit noise as compared to conventional nonmetallic boards with the same circuit. More specifically, such grounding has been found to reduce undesired intercoupling, radiation and eddy currents selectively to such an extent in a given circuit that it not only makes possible a reduction in circuit noise, but permits a substantial reduction in insulating surface area requirements. A reduction in the insulating areas, of course, directly makes possible a reduction in the overall size of the circuit board. This is naturally important in applications where circuit miniaturization is of primary importance.

Another advantage resulting from the use of a metal substrate is that the capacitance established between it and a given circuit may be accurately controlled and readily determined for any given coating thickness. This greatly facilitates the design of the printed circuit boards in advance of actual construction.

As a finished product, this novel circuit board also exhibits a number of other advantages over conventional nonmetallic counterparts. For example, the metal substrate is far superior to nonmetallic substrates in terms of strength, durability, and immunity to deterioration of electrical properties caused either by age or by exposure to certain chemical solutions normally involved in processing a circuit thereon. The last-mentioned aspect has proved particularly troublesome in conventional nonmetallic boards wherein two or more circuit holes, for example, must be closely spaced. In such situations, nonmetallic substrates have been found to absorb chemical solutions involved in electroplating, for example, to such an extent that electrical characteristics of the substrate are often permanently affected.

Another advantage of a metal substrate as embodied herein is that it greatly facilitates manufacture in terms of ease of forming, shaping, punching, etc., and in being conductive to bending and shaping into various configurations, such as a chassis, for example, as depicted in FIG. 5, either before or after a circuit has been formed thereon. A metal substrate is also more economical both to purchase as a raw material and to process, than either phenol fibre laminates or epoxy glass laminates utilized heretofore. A further important advantage of the present circuit board is that its metal substrate constitutes a very good heat sink and, thus, minimizes heat dissipation problems often encountered with nonmetallic boards.

There are a number of other important features and advantages applicable to the printed circuit board embodied herein which are derived from the novel method by which it is manufactured. These features and advantages will become more readily understood and appreciated when considered in conjunction with the flow chart of FIG. 3. Associated with the flow chart are three tabulated columns designated Operation, Material and Equipment. Each of these columns lists in succession pertinent information corresponding to the successive process steps of the flow chart. It is to be understood that the tabulated information is disclosed only for purposes of illustration, and in no way is to be construed as all-inclusive, or as necessarily being successively representative of the only or best process step, type of material or equipment, as the case may be, for every application. Similarly, all of the sequence steps illustrated in the flow chart are not necessarily essential for all printed circuit board applications, nor are all the steps required to produce a novel board in accordance with the principles of this invention. Those steps that are considered essential and unique in selective combinations will become more apparent hereinbelow. The various apparatus required to carry out the process steps identified in the serially arranged boxes of the flow chart may all be purchased commercially and are of well-known and conventional types. Accordingly, such equipment will only be shown schematically or pictorially in FIG. 4 and briefly described herein, a detailed description relating thereto not being considered either beneficial or necessary to the attainment of a clear understanding of this invention.

Starting with a prepunched (or drilled) metal blank 11 of steel, for example, which forms the printed circuit board substrate in accordance with the invention, the method of fabricating or processing the circuit thereon will now be described with reference to FIG. 4. The substrate is initially transported, such as by a suitable conveyor 40 and supporting means 41, depicted as a hook, to a chemical tank 42 containing a solution of alkali etch or caustic soda, for example, wherein the substrate is degreased. Other commercially available types of chemical solutions may be utilized with equal effectiveness. Alternatively, the substrate may be sand-blasted with grit, for example, by a nozzle supplied with grit under pressure.

As indicated by the flow chart of FIG. 3, a small area is then preferably masked by any well-known means, as indicated at work location 44 of FIG. 4, to provide a common ground terminal area 17 for the metal substrate. As previously pointed out, grounding of the substrate contributes to a substantial reduction in troublesome interference effects, particularly in circuits adapted for high frequency operation or involving high speed switching, and, thereby, reduces circuit noise and/or permits a reduction insulating surface area requirements between the various circuit leads. The ground connection may, of course, alternatively be provided by tapping, drilling or screwing a suitable metallic terminal member into or through a completely insulated metal board as a final step or as an added intermediate step. Conversely, if noise or size is not a problem, such as where the board is utilized primarily for mounting passive or direct current components, the step of providing a common ground terminal may be eliminated. In any case, the substrate is then transported to a suitable oven 46 where it is heated to a temperature above the fusion point of the particular insulating material utilized to coat the surface thereof. When the insulating coating comprises a commercially available epoxy resin, the substrate is normally heated between 450° and 525° F. There are a number of commercially available thermosetting epoxy resins which have been found to be particularly well suited for the applications described herein. Representative of such epoxy resins, and only given for purposes of illustration, are the following: Corvel ECA–1283, sold by the Resins Division of the Polymer Corporation, Reading, Pa.; and Vibro-Flo E–208, sold by the Armstrong Resins Corporation, Warsaw, Indiana. The oven 46 may comprise any one of a number of different types utilizing, for example, convection heating, resistance or induction heaters, or lamps 47 as shown.

Upon reaching the proper temperature, the substrate is transported to a work location 50 where the entire surface of the substrate 10, with the possible exception of the minor area 17 defining the common ground terminal, is coated with an insulating material 12, preferably epoxy resin, in an aerated tank or bed 51. The resin is maintained in a fluidized state, for example, by the application of air or gas supplied under pressure to the tank pictorially represented by a nozzle 53. It, of course, should be understood that in practice the inlet air is generally diffused, such as through a suitable porous membrane in any well-known manner, so as to establish a plurality of uniformly distributed ascending air streams to maintain the solid, pulverulent particles of plastic coating material in a fluidized state. More detailed information specifically related to the terminology and definitions of a fluidized bed may be obtained from an article entitled "Fluidization Nomenclatures and Symbols" appearing in Industrial and Engineering Chemistry, vol. 41, No. 6, pages 1249–1250, June, 1949. Alternatively, but less preferably, the article may be sprayed with an epoxy resin or a similar insulating material which adheres adequately to metal.

When the substrate is immersed in a fluidized bed of epoxy resin, it normally takes approximately three seconds to build up an insulating coating thickness of approximately 15 mils. It is interesting to note, and of importance to a circuit design engineer, that an optimum epoxy resin coating thickness was found to be in the vicinity of 16.5 mils, beyond which only a comparatively small reduction in circuit to substrate capacitance occurred. It is to be understood herein that a thermosetting epoxy resin is described only by way of example; other insulating materials such as organic polymeric thermoplastic resins may be utilized in certain applications with equal effectiveness.

Coating a perforated metal substrate, as distinguished from a non-perforated substrate of the prior art, with an epoxy resin in an aerated tank has been found to give rise to very important features and advantages relating to hole formation. More particularly, as depicted in FIG. 2, the epoxy resin 12 builds up a coating on the walls of the holes such that they become crescent-shaped, with the peripheral edges of the holes being rounded and smoothly contoured into the planar surface areas of the substrate. In fact, the coated holes actually become cusp-shaped at opposite ends. This type of coating build-up is very important in a number of respects. First, it reduces the diameter of the holes to be subsequently plated. This allows the preformed holes to be of a larger diameter than the finally plated-through holes and, consequently, greatly facilitates the punching or drilling operations, particularly with respect to miniaturized circuit boards. Secondly, the rounded edges and crescent-shaped walls of the holes greatly facilitate the attainment of a metallic coating 18 therein (FIG. 2) of uniform thickness during subsequent metal plating or deposition operations. This, of course, also has a direct effect on improving the electrical and thermal characteristics of a given circuit.

In addition, the cusp-shaped hole openings, as depicted in detail in FIG. 2, form very effective, small diameter land areas which have arcuate surfaces extending partially below the outer planar surfaces of the insulating coating 12. As a result, the outer surface diameter of a land area constructed in accordance with the invention may be much smaller than the outer diameter of a planar surfaced land area on a conventional circuit board. Accordingly, hole spacing is not nearly as restricted because of land area dimensional requirements in the board embodied herein as it is in conventional boards. Further, the land areas embodied herein make possible the formation of very small and reliable soldered fillets 19 when terminal leads 16 are to be inserted within or through the holes.

Another factor that should be noted is that the holes are normally drilled in conventional boards after the circuit has been fabricated and, due to practical limits on mechanical tolerances, a 5 to 10 mil error can often occur in centering the drilling apparatus from one hole to the next. This often necessitates that a larger diameter land area be utilized than would otherwise be required in conventional boards. Significantly, in the present invention, there are no mechanical linkages, gears or other parts necessitating relative mechanical movement during fabrication once the prepunched substrate, mask and photoexposure apparatus (if any) are properly aligned. Moreover, after the mask has been properly positioned on the substrate, there is no subsequent need for any relative movement between these elements which could give rise to multiple or compound errors in circuit alignment.

After the epoxy coating has been applied to the substrate, it is again transported to a suitable oven 55 which may be similar or identical to oven 46, to cure the insulating material. The temperature in this oven is generally about 400° F. and the duration approximately 15 minutes when the aforementioned types of epoxy resins are employed.

The substrate is next transported to a work location where the surface of the insulating material is abraded. This may be accomplished in a number of ways, such as by subjecting the insulating surface to a spray of aluminum oxide (grit), or sand, utilizing either a sand blaster 57 as shown or a conventional slurring machine. A suitable chemical etch may also be utilized to abrade the insulating surface. The purpose of abrading the epoxy surface is to obtain good adhesion of metal thereto in a subsequent processing operation.

The abrasion step is followed by a combination of a seeding and sensitizing operation to catalyze the surface of the epoxy coating. These two surface treatments may be performed separately but are normally performed in a single operation by immersing the coated substrate in a chemical tank 60 containing, for example, stannous chloride and palladium chloride, both commercially available. The stannous chloride acts to seed (or wet) the epoxy-coated surface to insure uniform coating of metal thereto when a subsequent electroless metal deposition process is to be performed. More specifically, the stannous chloride gives up an ion to the palladium chloride, whereby the latter becomes metallic palladium and acts as a catalyst to sensitize the epoxy-coated surface when immersed in a subsequent electroless chemical solution.

With the surface of the epoxy coating thus conditioned, the substrate is then transported to another chemical tank 62 and immersed in a commercially available electroless solution. Here a very thin metallic layer, such as of copper, is deposited on the entire surface of the substrate, which will hereinafter be referred to as the "circuit board" or simply as the "board." Prior to this metal deposition operation, the board, with the possible exception of the ground terminal area, is nonconducting and therefore could not be utilized as the cathode in an electrolytic process for coating metal thereon. Accordingly, an electroless process is ideally suited for depositing a thin coating of copper, for example, on the insulating surface of the board so that the board may be used as an electrode in a subsequent electroplating operation. To obtain a coating thickness of approximately 0.000050 inch, a period of approximately 15 minutes is required. It is to be understood, of course, that if time were not critical, an electroless process could be utilized to apply the circuit directly to the board through an appropriate mask. At this time, however, such a process does not appear to be practical, particularly with respect to the time required for applying a metallic coating having a thickness between 1.5 and 3.0 mils as generally desired for printed circuits.

Further, as a result of the smooth, epoxy-coated, cusp-shaped hole formations, the electroless process has been found to deposit a metallic coating of very uniform thickness therein. The uniformity of this coating, in combination with a subsequent electroplated coating of greater thickness, insures that both the electrical and thermal characteristics of a given circuit may be manufactured consistently to within very close limits of the optimum characteristics established by circuit design.

At the next work location some form of either the well-known silk-screen process or the photo resist process is normally employed to mask the board with the desired circuit configuration. In the case of the silk-screen process, either a commercially available tar extract or photo ink may be utilized with a fine mesh, stainless steel screen 64, exposed to a suitable ultraviolet light 65 through a positive circiut transparency, for example, as pictorially shown.

After the masking operation the circuit board is transported to and immersed in an electrolytic tank 67 containing an acid copper solution, for example. The board is biased negatively by a source 68 with respect to an anode 69 as shown. A coating of copper, usually about 1.7 mils in thickness, has been found to be adequate for most circuit applications. In a conventional chemical plating tank with a commercially available solution, this coating operation normally takes about thirty minutes.

The board is then transported to another chemical plating tank 70 where a liquid metal solution, such as citrate gold or 60-40 solder, for example, is electroplated on it to provide a thin, nonoxidizing coating. Of course, other nonoxidizing metals such as silver, nickel, platinum, etc., may similarly be utilized for this purpose. The necessary potential sources for this tank may be similar to those of tank 67.

The printed circuit board is next transported to a chemical tank 72 where a chemical solution containing, for example, benzene and trichlorethylene, may be utilized to remove the resist material if it were involved in the masking operation. Resist material may, of course, be removed by mechanical means, such as scrubbing with a bush, if mass production processing is not involved.

Finally, the circuit board is transported to a conventional chemical tank 74 wherein a solution of ferric chloride or ammonium persulphate, for example, is utilized to remove or etch away the thin electroless deposited layer of copper covering the ultimately intended insulating surface areas between the conducting leads and holes. As this coating is only of the order of .000050 inch in thickness, there is very little metal wasted in the process of plating circuit boards in accordance with the principles of this invention. This not only reduces the cost of manufacturing the boards, but it substantially minimizes the problems involved in continuously removing the copper etched from a large number of boards when mass production techniques are employed. Also, line definition is improved as only a short etch time is involved.

In certain applications, such as in commutators or sliding contact switches, it may be desirable to apply heat and pressure to the metallic conductor such that they become embedded in the insulating coating and flush mounted therewith. Such an arrangement, as depicted in FIG. 6, wherein the various elements corresponding to those depicted in FIGS. 1 and 2 are similarly identified, would of course also provide a more rugged circuit board, as greater adhesion between the conductors and insulating material would normally be obtained.

One preferred illustrative step-by-step sequence has thus been presented for manufacturing a unique printed circuit board utilizing a metal-based substrate. It should be noted that while metal substrates have been epoxy coated heretofore for other unrelated purposes, they have never been coated in the manner set forth herein to provide a finished printed circuit board exhibiting the many advantages and features embodied and claimed herein. More specifically, no prior circuit boards have effected a substantial reduction in circuit noise and/or permitted a reduction in land area requirements by grounding an entire metal substrate. Similarly, the method of processing a printed circuit on a metal-based, prepunched (or drilled) substrate, has been shown to provide unique hole configurations giving rise to a substantial improvement in the thermal and electrical properties of a given circuit. The present method of manufacture also affords substantial reductions in the cost of manufacture. Such reductions result primarily from the ease of forming the blank substrates, from a cost saving in purchasing raw metallic versus non-metallic substrate materials, and from a reduction in the amount of plating material normally wasted during etching operations.

Finally, the cusp-shaped holes, with pigtail leads therein, permit the formation of soldered fillets which do not require large-diameter land areas or islands surrounding each hole. This not only permits very close spacing of the holes, but greatly facilitates and insures reliable soldering of pigtails therein when mass production soldering techniques are employed, such as those involving fountain or flowing solder baths.

Figure 7A:
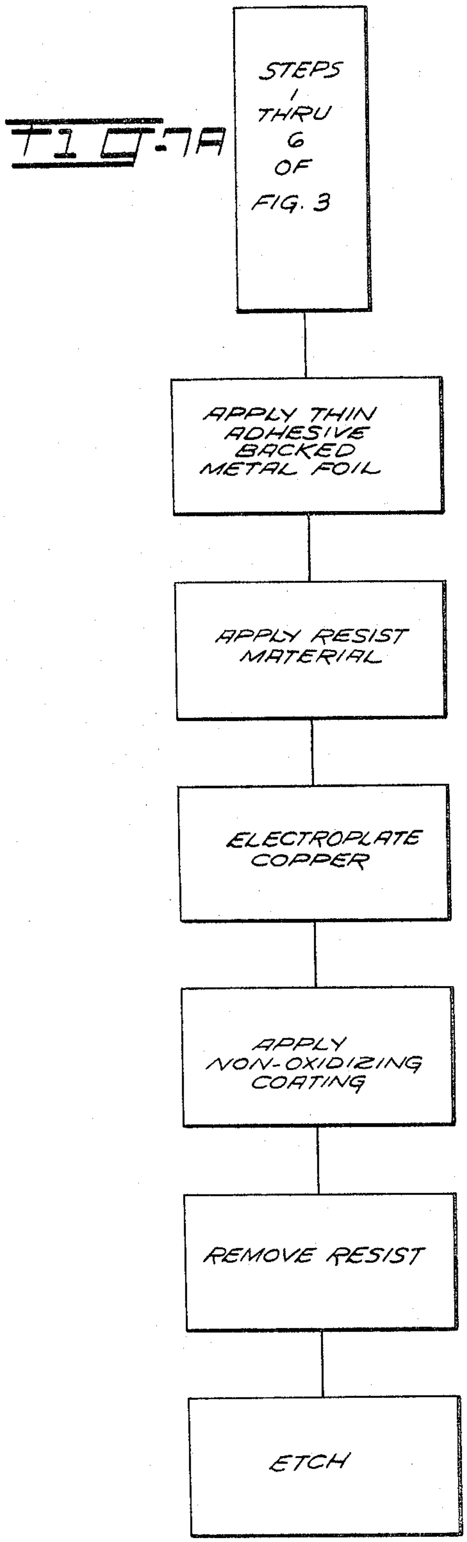

If the very uniform and accurately controlled plated-through holes are not essential in some simple circuit applications, a commercially available adhesive-backed copper foil may be utilized in place of the electroplating and/or the electroless process steps to provide a suitable circuit configuration on the insulated board. FIG. 7*a* depicts a flow chart applicable to one of such alternative processes, wherein a very thin, adhesive-backed copper laminate is applied to the epoxy coating, for example. This operation then follows the sequence of steps set forth in the flow chart of FIG. 3.

Figure 7B:
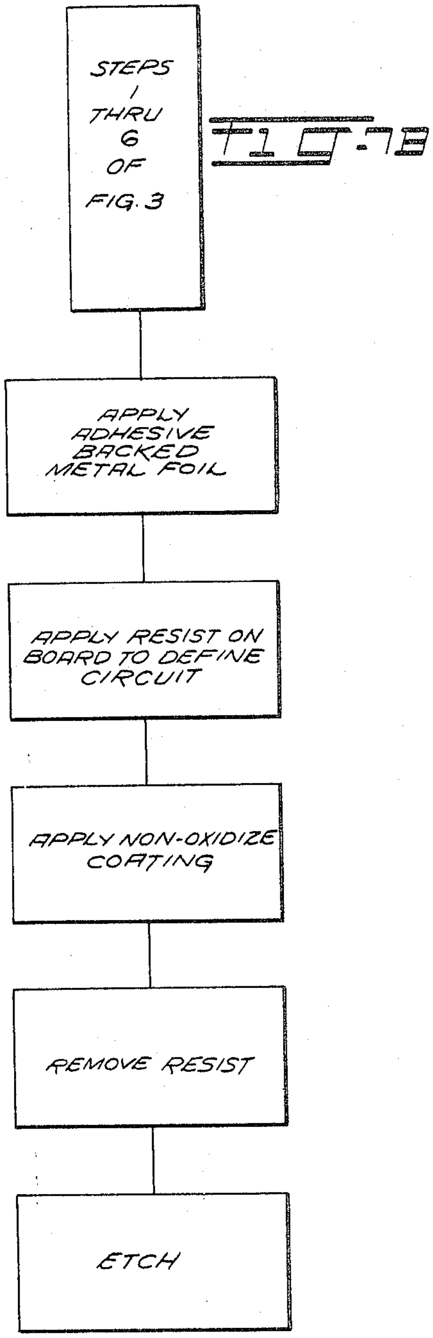

A modification of this technique is depicted in the flow chart of FIG. 7*b* wherein a single, adhesive-backed layer of copper is bonded to the insulating coating of the board. This layer of copper has a thickness sufficient for the circuit leads desired and, thereby eliminates not only the abrasion, seeding, and sensitizing steps, but also the electroless and electroplating operations set forth in the flow chart of FIG. 3. The latter technique, of course, requires etching away a greater amount of copper to define the desired circuit configuration than the process depicted in FIG. 7*a* wherein the circuit is electroplated through a mask in much the same manner as involved in the process disclosed in FIG. 3.

By way of comparison, a number of tests were performed on three distinct types of circuit boards, two being of conventional types utilizing substrates of phenol fibre laminate (XXXP) and epoxy glass laminate (G–10), the third comprising aluminum and processed in accordance with the method set forth in FIG. 3. Very significantly, the metal-based board produced approximately a 10 db reduction in circuit noise over either of the nonmetallic based boards, with all of the boards having the same electrical circuit respectively fabricated thereon. Moreover, short-time, 60-cycle dielectric strength tests on the aluminum base circuit boards under test showed remarkably consistent and high breakdown values with no tendency for the epoxy resin to carbonize at points where flash-over occurred from the edge of a two-inch electrode to a lung on the metal plate to which the grounded side of the test circuit was connected. The metal substrate was also tested with direct current voltages up to 5000 volts without evidence of any breakdown or flash-over.

It is to be understood that the specific embodiments described herein, and their methods of manufacture, are merely illustrative of the general principles of the instant invention. For example, numerous other chemical solutions, types of metal substrates and insulating coatings could be employed in place of those specifically described for purposes of illustration. Similarly, the process steps set forth in the various flow charts and described herein could be carried out by apparatus distinguishing in appearance or name from that illustrated and described but, nevertheless, utilized to perform the same functions and results realized in accordance with the principles of the instant invention. Such other structural arrangements and modifications and/or variations in method steps for processing printed circuits or decorative metallic patterns as embodied herein may obviously be devised in the light of this disclosure without departing from the spirit and scope of this invention.

What is claimed is:

1. A method of fabricating a conductive pattern including plated-through holes on an insulated supporting base comprising the steps of:
perforating holes in a predetermined pattern in a thin metal substrate,
heating said substrate to within a first predetermined temperature range,
applying a coating of an insulating material maintained in a fluidized state to and in adherence with at least one major surface area of said substrate including the holes associated therewith, said heated substrate being exposed to said material for a sufficient period of time to allow an adequate insulating build-up on the major surface of said substrate and to form substantially crescent-shaped walls within and smoothly rounded peripheral edges at the extremities of the holes associated with at least said major area when the holes are viewed in cross section,
thermally curing said insulating coating within a second predetermined temperature range,
masking at least a portion of said insulating coating to define a distinct pattern of desired configuration,
exposing said pattern to a metallic electroless solution to formulate a metal coating thereon, and
removing said mask.

2. A method in accordance with claim 1 wherein said insulating material comprises a solid, pulverulent, thermosetting epoxy resin.

3. A method of manufacturing printed wiring boards and the like with plated-through holes comprising the steps of:
forming a predetermined array of holes in a thin metal substrate,
heating said substrate to within a first predetermined temperature range,
applying a coating of insulating material maintained in a fluidized state, and fusable within said first temperature range, to at least one major surface area of said heated substrate, said substrate being exposed to said material a sufficient period of time to allow an adequate insulating build-up on said major surface area and to form substantially crescent-shaped walls within and smoothly rounded peripheral edges at the extremities of the holes associated with said area when the holes are viewed in cross section,
thermally curing said insulating coating within a second predetermined temperature range,
applying a metallic layer on the entire surface of said insulating coating including the walls of said holes,
masking at least a portion of said metallic layer and at least certain holes associated therewith to define an exposed pattern of desired configuration thereon,
applying a metal coating to said exposed pattern of said metallic layer,
removing said mask, and
etching away the previously masked portions of said metallic layer on said insulating coating, thus leaving a desired metal pattern on said insulating coating.

4. A method in accordance with claim 3 wherein said insulating material comprises a solid, pulverulent, thermosetting epoxy resin, wherein said step of applying a metallic layer on the surface of said insulating coating comprises an electroless process of metal deposition, and wherein said step of applying a metal coating to said exposed area defining said pattern of desired configuration comprises an electroplating process.

5. A method of producing a printed circuit pattern which comprises the steps of:
forming a predetermined array of holes in a thin metal substrate, said holes having walls which form sharp peripheral edges at the surface of said substrate,
maintaining a mass of pulverulent epoxy resin in a fluidized state, said resin being fusable within a first temperature range and being curable within a second temperature range, heating said substrate to within said first temperature range, inserting said heated substrate into said mass to produce an epoxy resin coating on the surface of said substrate and on said hole walls, removing said substrate from said mass after said hole walls and said substrate surface have received a coating of said epoxy resin sufficient both to produce a rounded coating over said sharp peripheral edges and to produce a crescent-configurated coating on said walls when said holes are viewed in cross section, heating said epoxy resin coating to within said second temperature range to cure said epoxy resin coating, coating said cured epoxy resin coating with a metal layer, forming a masking coating on said metal layer to expose a positive pattern thereof and to cover a negative pattern thereof, applying a metal coating to said exposed positive pattern of said metal layer, removing said masking coating, and etching away said negative pattern of said metal layer which was covered by said masking coating, thereby producing a printed circuit pattern.

6. A method in accordance with claim 5 further comprising the step of applying a nonoxidizing coating to the metal coating prior to removing said masking coating.

7. A method in accordance with claim 5 further comprising the final step of applying heat and pressure to said printed circuit pattern to embed said pattern in said cured epoxy resin coating so it is mounted flush therein.

8. A method of producing a printed circuit board which comprises the steps of:

forming a predetermined array of holes in a metal substrate, said holes having walls which form sharp peripheral edges at the surface of said substrate, degreasing said substrate, applying insulating coating to said punched and degreased substrate, including the steps of:

maintaining a mass of pulverulent epoxy resin in a fluidized state, said resin being fusable within a first temperature range and being curable within a second temperature range, heating said substrate to within said first temperature range, inserting said heated substrate into said mass to coat said substrate surface and said hole walls with said epoxy resin, maintaining said substrate in said mass for at least three seconds, and removing said substrate from said mass after said hole walls and said substrate surface have received a coating of said epoxy resin sufficient both to produce a rounded coating over said sharp peripheral edges and to produce a crescent-configurated coating on said walls when said holes are viewed in cross section, heating said epoxy resin coating on said substrate to within said second temperature range to cure said epoxy resin coating, catalyzing said cured epoxy resin coating, immersing said catalyzed epoxy resin coating in an electroless plating bath for approximately fifteen minutes to produce a uniform metal layer on said cured epoxy resin coating, forming a masking coating on said metal layer to expose only a positive pattern thereof and to cover a negative pattern thereof, electroplating a metal coating on said exposed positive pattern of said metal layer, applying a nonoxidizable metal covering to said metal coating, removing said masking coating, and etching away the negative portion of said metal layer which was covered by said masking coating.

9. A method in accordance with claim 8 wherein said first predetermined temperature range is between 450° and 525° F., wherein said step of applying said insulating coating to said substrate comprises immersing said substrate in an aerated tank of epoxy resin maintained in a fluidized state, and wheren said second predetermined temperature range is approximately 400° F.

10. A method of producing a printed circuit pattern which comprises the steps of:

forming a predetermined array of holes in a metal substrate, said holes having walls which form sharp peripheral edges at the surface of said substrate, maintaining a mass of pulverulent epoxy resin in a fluidized state, said resin being fusable within a first temperature range and being curable within a second temperature range, heating said substrate to within said first temperature range, inserting said heated substrate into said mass to produce an epoxy resin coating on said substrate surface and on said hole walls, removing said substrate from said mass after said hole walls and said substrate surface have received a coating of said epoxy resin sufficient both to produce a rounded coating over said sharp peripheral edges and to produce a crescent-configurated coating on said walls when said holes are viewed in cross section, heating said epoxy resin coating to within said second temperature range to cure said epoxy resin coating, forming a masking coating on said cured epoxy resin coating to expose a positive pattern thereof and to cover a negative pattern thereof, applying a metal layer to said exposed positive pattern of said cured epoxy resin coating, and removing said masking coating.

References Cited by the Examiner

UNITED STATES PATENTS

| | | | |
|---|---|---|---|
| 2,958,120 | 11/1960 | Taylor. | |
| 2,974,284 | 3/1961 | Parker | 174—68.5 |
| 3,202,591 | 8/1965 | Curran | 174—68.5 |

OTHER REFERENCES

Pascoe, W. R., Materials in Design Engineering February 1960, pp. 91–95.

JOHN H. MACK, *Primary Examiner.*

T. TUFARIELLO, *Assistant Examiner.*